United States Patent
Chakravarti et al.

(10) Patent No.: US 7,232,774 B2
(45) Date of Patent: Jun. 19, 2007

(54) POLYCRYSTALLINE SILICON LAYER WITH NANO-GRAIN STRUCTURE AND METHOD OF MANUFACTURE

(75) Inventors: Ashima B. Chakravarti, Hopewell Junction, NY (US); Bruce B. Doris, Brewster, NY (US); Romany Ghali, Linden, NJ (US); Oleg G. Gluschenkov, Poughkeepsie, NY (US); Michael A. Gribelyuk, Stamford, CT (US); Woo-Hyeong Lee, Poughquag, NY (US); Anita Madan, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 10/707,878

(22) Filed: Jan. 20, 2004

(65) Prior Publication Data

US 2005/0158924 A1    Jul. 21, 2005

(51) Int. Cl.
   *H01L 21/00*    (2006.01)
(52) U.S. Cl. ............... 438/799; 438/795; 257/E21.517
(58) Field of Classification Search ............. 438/488, 438/495, 795, 799; 252/E21.517
   See application file for complete search history.

(56) References Cited

U.S. PATENT DOCUMENTS

2002/0106841 A1* 8/2002 Yamazaki et al. .......... 438/149
2005/0146938 A1* 7/2005 Forbes .................. 365/185.18
2005/0266685 A1* 12/2005 Nakano et al. ............. 438/660
2006/0046383 A1* 3/2006 Chen et al. ................. 438/257

FOREIGN PATENT DOCUMENTS

| JP | 11-243188   | 9/1999  |
| JP | 2000-150882 | 5/2000  |
| JP | 2002-373944 | 12/2002 |
| JP | 2004-071653 | 3/2004  |

OTHER PUBLICATIONS

Silicon Processing for the VLSI Era, S. Wolf and R. N. Tauber, Lattice Press, Sunset Beach CA, USA 1986—pp. 179-181.

* cited by examiner

*Primary Examiner*—Bradley K. Smith
(74) *Attorney, Agent, or Firm*—Ira D. Blecker

(57) ABSTRACT

A method of forming polycrystalline silicon with ultra-small grain sizes employs a differential heating of the upper and lower sides of the substrate of a CVD apparatus, in which the lower side of the substrate receives considerably more power than the upper side, preferable more than 75% of the power; and in which the substrate is maintained during deposition at a temperature more than 50° C. above the 550° C. crystallization temperature of silicon.

9 Claims, 1 Drawing Sheet

POLYCRYSTALLINE SILICON LAYER WITH NANO-GRAIN STRUCTURE AND METHOD OF MANUFACTURE

BACKGROUND OF INVENTION

Technical Field

The field of the invention is that of integrated circuit fabrication, in particular forming very small structures from polycrystalline silicon.

Current CMOS scaling trends require the poly gate length to become smaller with successive generations of technology. Currently, state of the art high performance logic uses gates that are well below 100 nm, and more preferably below 30 nm. On the other hand, standard poly Si grains sizes are approximately 40–70 nm. This implies that the grain size of poly Si is approaching the same dimensions as the physical dimension as the gate itself.

Another important feature of CMOS scaling is electrical thinning of the gate oxide. One disadvantage of using poly-Si as the gate conductor is that the poly-Si becomes depleted in the region of the SiO2-poly-Si interface as a result of channel inversion. The unwanted depletion is an effective electrical thickening of the gate oxide. Improving gate activation minimizes poly depletion effects. Therefore, it would be desirable to improve poly Si gate activation.

The standard approach in the art has been that small poly crystals are best produced by maintaining the temperature of the wafer being coated at a temperature close to and only slightly above the crystallization temperature of silicon. In the case of some tools, we can monitor only substrate holder temperature. Below that temperature, the silicon film is amorphous. The standard reference book on silicon processing technology, Silicon Processing for the VLSI Era, by S. Wolf and R. N. Tauber, Volume 1—Process Technology (Publisher Lattice Press, Sunset Beach, Calif., 1986 ) teaches this low temperature approach, which does produce smaller grains than earlier methods, but not enough to be suitable for 30 nm gate dimensions.

Those skilled in the art will appreciate that amorphous silicon produces a highly uniform film, but is not desirable for use as a transistor gate and other sub-100 nm processing because amorphous silicon turns into far larger grain poly-Si due to the higher temperature(higher than the amorphous-Si deposition temperature) anneals that used to occur after deposition. Since the current and future technology needs sub-50 nm poly-si gate CD, larger grain poly-si makes poly-si etch and poly-si doping more difficult.

Thus, there is a need for deposition methods which will enable polysilicon films with a typical grain size of below 20 nm, and preferably below 10 nm.

SUMMARY OF INVENTION

The invention relates to a technique for depositing polycrystalline silicon with small grain sizes having a mean size of less than 30 nm.

A feature of the invention is that the reactant gases are heated differently from the substrate.

Another feature of the invention is that the substrate is maintained at a temperature considerably higher than the crystallization temperature.

Another feature of the invention is the formation of a structured silicon film that has small grains of poly-si at the bottom and amorphous silicon at the top.

DETAILED DESCRIPTION

Figure 1:
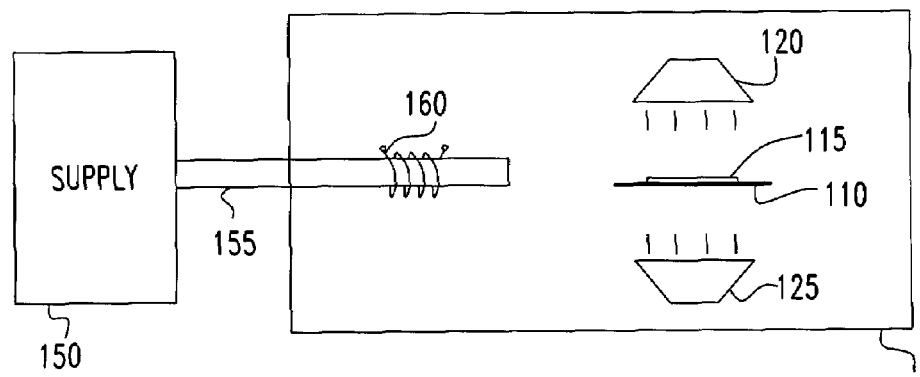
FIG. 1 shows a schematic view of a deposition apparatus.

FIG. 1 shows a simplified representation of a deposition apparatus suitable for use with the invention, such as a single wafer tool, in which vacuum chamber 100 encloses a substrate 110 that holds wafer 115 during the deposition process.

On the left of the Figure, gas source 150 represents the supply for the reactant gases that enter the chamber along pipe(s) 155 and combine in the chamber to form the desired film.

Within chamber 100, heat sources 125 (lower) and 120 (upper) direct infra-red radiation at the lower and upper surfaces of the substrate. Source 120 also heats the arriving gases. Heating coil 160 represents schematically various methods of heating the reactant gases before they are released into the chamber. Optionally, the temperature of the gases may be adjusted independently of the heat lamps heating the wafer.

The teaching of the prior art was that small poly grains are best produced by supplying equal power to the upper and lower lamps and by maintaining the substrate slightly above the crystallization temperature of 550° C.

It has been found that considerably better results are obtained by supplying a greater amount of heat to the bottom lamps and by maintaining the substrate at a temperature considerably greater than the crystallization temperature for forming poly.

Problems that arise in fabricating field effect transistors in sub-100 nm dimensions include poor performance caused in part by depletion of the poly at the oxide-poly interface, caused by a lower than desirable concentration of dopant at the interface.

One possible technique to improve poly depletion is to have more active dopants at the SiO2-poly-Si interface.

Dopants arrive at the SiO2-Poly-Si interface by two path-ways. One path is diffusion in the crystal poly Si, the other path is by diffusion along the grain boundaries. Diffusion in grain boundaries is much faster than diffusion within the crystalline silicon. Since gate dimensions are about the same size as the poly-Si grain sizes, most of the diffusion takes place within the crystalline silicon rather than the grain boundary for nominal size transistors. This means that poly depletion may be improved for nominal gates by using poly Si with smaller grain sizes.

Figure 2A:
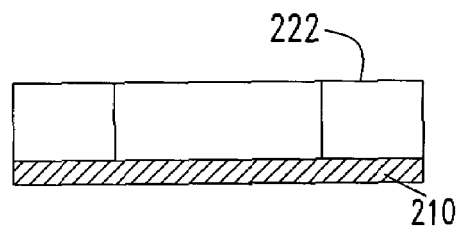
FIG. 2A shows a simplified view of a prior art silicon film.

FIG. 2A shows a schematic representation of a layer of gate oxide 210 having a layer of poly deposited on it, the poly having one layer of grains 220. The poly in FIG. 2A is conventional, having crystals of normal dimension of mean length about 40 nm. In this example, using a length of 80 nm for the gate, there is only one grain boundary 222 in the first layer of the poly. For convenience in illustration, the grains are shown as rectangles. Those skilled in the art will appreciate that the actual grain shapes will be more complicated.

After a diffusion step, there will be a concentration of dopant at the grain boundary 222 adjacent to oxide 210, since diffusion is faster along the boundaries. Subsequent annealing and other high temperature steps will spread the dopant concentration, but this irregular initial distribution is a disadvantage.

Figure 2B:
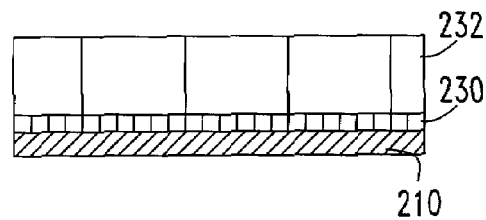
FIG. 2B shows a similar simplified view of a film formed according to the invention.
Figure 3:
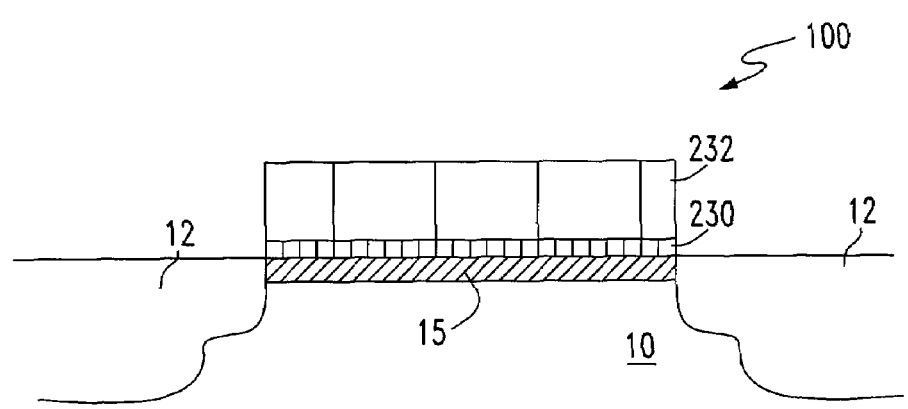
FIG. 3 shows a cross section of a FET made according to the invention.

FIG. 2B shows a similar structure, with crystal grains having a size of 10 nm. There will be considerably more grain boundaries in this case and the initial distribution of dopant will be more uniform than in the case of FIG. 2A.

Despite many attempts to arrive at process conditions to achieve small grain poly-Si we have determined that conventional LPCVD techniques are not capable of producing a suitable poly Si film. Small grain poly films deposited by LPCVD were found to have voids at the SiO2-poly interface which cause formidable problems for the gate stack etch since the voids get transferred down to the Si substrate. In addition, the small grain LPCVD film had very rough surface topography which causes problems for lithography.

In addition to improved gate depletion characteristics, small grain poly-Si has several advantages over conventional poly-Si films for gate electrode applications in terms of lithography and etch.

We have demonstrated that by using novel process conditions according to the invention, a smooth, small grain poly Si film may be produced. The smoother film results in improved thickness uniformity. Improved thickness control results in improved lithography and etch by enhancing line width control (ACLV) and line edge roughness (LER). It will also result in improved electrical uniformity in MOSFET devices by making vertical poly-Si doping very uniform. In this disclosure, methods are described how to optimize the grain size by changing the process conditions.

It is found that the most important parameter that affects the grain size is how the reactant gases are heated in the chamber. This is in contrast to the prior art teaching which identifies the substrate temperature as the primary parameter for controlling grain size. For instance, the reference book on silicon processing technology (by S. Wolf, Silicon Processing for the VLSI Era, Volume 1—Process Technology) teaches that polysilicon grains can be reduced by lowering substrate temperature close to the crystallization temperature of the silicon. Eventually, the film can be made amorphous by dropping the substrate temperature to below the crystallization temperature.

Unfortunately, such an approach results into either an amorphous film where the grain boundaries are absent or a conventional polysilicon film with a typical grain size of the order of 40 nm.

Since the grain size of a polysilicon film is a random function, the quantitative measure of grain size is a statistical distribution. An experimental grain size distribution can be approximated by a Normal distribution. The Normal distribution is typically characterized by the mean value of grain size and the standard deviation of grain size. Therefore, the requirement for small grain polysilicon can be specified in terms of mean grain size and standard deviation of that.

Because the state-of-the-art gate length is about 30 nm or less, there is a need for polysilicon film with a grain distribution that has the mean grain size of about 20 nm or less and the grain size standard deviation of 10 nm or less. Such collection of grains will be referred to as "nanograins".

One objective of the present disclosure is to provide a deposition method which allows for polysilicon films with ultra small grains. Another objective of the present disclosure is a patterned polycrystalline Si film with "nanograins" such that each polysilicon structure contains at least several grain boundaries connecting the bottom interface to the top portion of the film.

Yet another objective of the present disclosure is the MOSFET gate structure which incorporates the patterned polycrystalline Si film with "nanograins".

The experiments were performed in a commercial deposition chamber. The chamber provided means to partially decouple heating of the process gas and the substrate. The chamber was equipped with two sets of heating lamps: one placed above the substrate and the other placed below the substrate. Typically, 50% of power is supplied to the lamps on the top, and 50% at the bottom. By changing the percentage of power supplied to the top and the bottom lamp, one can change the temperature to which the gas is subjected to. We discovered that, by supplying 80% of the power to the bottom, the grain sizes reduce substantially. The application of this disclosure is not limited to a particular design of the chamber. Any chamber where the substrate and the reactant gas temperatures can be independently controlled can be used.

The total quantity of power will depend on the structure of the chamber (more distant lamps will need more input power to produce the same temperature than close lamps). Thus, the following discussion refers to the allocation of the total power.

Those skilled in the art will appreciate that the main factor influencing grain size is unexpectedly the application of more power to the substrate than to the upper surface and the use of a much higher temperature than the crystallization temperature, contrary to the teaching of the prior art.

Tables I and II summarize the data. Though the smallest grain poly was obtained at the slowest deposition rate, there seems to be no correlation between the deposition rate and grain size. In addition, the smallest grain size was obtained at the substrate temperature range of 690–710 C. which is far above the crystallization temperature range of 550–600 C.

The grain size references of <111> and <221> are to the standard method of description according to orientation.

The grain sizes were verified by TEM. It is seen that for the 690° C. process, the silicon starts as small grains, but halfway during the process, it turns into amorphous silicon (without changing the applied heating power). This observation can have significant advantages in subsequent litho steps by making the top surface of the gate conductor smoother. Since the line width control becomes very tight in 100 nm and sub-100 nm technology, the smoother surface morphology is essential to guarantee the device performance within a small variation.

This dual structured layer (amorphous structure on the top and poly structure at the bottom) poly-Si formation technique can also reduce the number of processing steps required to amorphize the top surface of poly silicon gate during the poly-Si gate doping.

This dual structured silicon layer was observed to become a single-component polycrystalline structure as the deposition temperature increases above 650° C. The higher wafer temperature enhances the rearrangement of the silicon lattice in a certain grain structure and helping the growth of crystal structure as well-described in the conventional deposition method. Even in this single poly-Si layer, a grain size change has been observed, that is, a smaller grain at the bottom of poly-Si layer (at the oxide interface) and larger grain at the top of the layer. This is thought to be mainly due to the deposition temperature related kinetics. Once the deposition temperature is high enough to keep the polycrystalline structure, the crystal growth can be maintained in a grain so the same crystal structure becomes taller and wider as the deposition goes on. However, the deposition temperature is not high enough, in other words, in between amorphous and polycrystalline silicon generating temperatures, the initial crystalline structure generated by slow deposition rate as crystalline islands on the oxide layer can not maintain the crystal growth any longer after some time of growth. Eventually, it becomes an amorphous structure after a very small grain, non-columnar poly-Si growth.

This large grain poly will make dopant diffuse faster down to the small grain poly-Si interface and the smaller grain at the bottom will increase the poly-Si doping since the dopants diffusion from the grain boundary into the crystalline silicon at the interface of SiO2 and small grain poly-Si layer. This small grain poly layer also creates longer grain boundary paths and eventually help retard the dopant diffusion compared to vertical straight grain boundaries in the conventional columnar structured poly-Si. This is definitely beneficial by suppressing gate poly dopant penetration into the channel which is a serious challenge in the extremely scaled current and future nano-scale MOS (metal-oxide-semiconductor) technology with ultra-thin gate oxide that is in the range of about 10 Angstroms.

Thus, lower dopant concentration at the top of poly-Si and higher dopant concentration at the SiO2/poly-Si interface can be obtained. This dopant profile is beneficial to improve the device performance by reducing poly-Si depletion capacitance at the bottom and by reducing polycide resistance increase which is mainly caused by the higher dopant concentration of poly-Si at the top.

The unique process conditions that have been identified are shown to produce the smallest grain sizes to our knowledge. The grain size distribution can be determined by X-ray diffraction measurement. The result of such measurement is reported in the tables below. The 710° C. process gives the smallest mean grain size of about 10 nm. At both 690° C. and 710° C., the smallest combined grain size was for the highest percentage of power in the lower lamps.

TABLE I

| | Temp (° C.) | | | | | |
|---|---|---|---|---|---|---|
| | 690 | 690 | 690 | 690 | 690 | 690 |
| Lower Power % | 44 | 20 | 80 | 44 | 44 | 44 |
| Grain Size <111> | 10.4 | 13.5 | 14.4 | 10.7 | 10.5 | 11.6 |
| Grain Size <221> | 45.3 | 47.2 | 21.4 | 45.3 | 45. | 49.3 |

TABLE II

| | Temp (° C.) | | | | |
|---|---|---|---|---|---|
| | 710 | 710 | 710 | 710 | 710 |
| Lower Power % | 20 | 80 | 44 | 44 | 44 |
| Grain Size, nm <111> | 12.8 | 8.6 | 10.2 | 10.9 | 12.4 |
| Grain Size, nm <221> | 40 | 10.7 | 42 | 42 | 50 |

While the invention has been described in terms of a single preferred embodiment, those skilled in the art will recognize that the invention can be practiced in various versions within the spirit and scope of the following claims.

What is claimed is:

1. A method of forming a layer of silicon on a surface of a workpiece comprising the steps of:

heating said workpiece on a substrate in a vacuum chamber;

depositing a layer of silicon on a surface of said workpiece;

in which said step of heating comprises supplying more than half of a total heating power to a lower surface of said workpiece in which said heating power is supplied by an upper set of lamps disposed above said workpiece and a lower set of lamps disposed below said substrate, whereby said workpiece is maintained at a deposition temperature greater than a crystallization temperature of silicon during the depositing of the layer of silicon, in which approximately eighty percent of said heating power is supplied to said lower set of lamps.

2. A method according to claim 1, in which said substrate is maintained at a temperature of greater than 690° C.

3. A method according to claim 2, in which said substrate is maintained at a temperature of less than 710° C.

4. A method according to claim 1, in which said substrate is maintained at a temperature of less than 710° C.

5. A method of forming a layer of silicon on a surface of a workpiece comprising the steps of:

heating said workpiece on a substrate in a vacuum chamber;

depositing a layer of silicon on a surface of said workpiece;

in which said step of heating comprises supplying more than 75% of a total heating power to a lower surface of said workpiece, whereby said workpiece is maintained at a deposition temperature greater than a crystallization temperature of silicon during the depositing of the layer of silicon.

6. A method according to claim 5, in which said heating power is supplied by an upper set of lamps disposed above said workpiece and a lower set of lamps disposed below said substrate.

7. A method according to claim 6, in which said substrate is maintained at a temperature of greater than 690° C.

8. A method according to claim 5, in which said substrate is maintained at a temperature of greater than 690° C.

9. A method according to claim 5, in which said substrate is maintained at a temperature of less than 710° C.

* * * * *